United States Patent
Wang et al.

(10) Patent No.: US 12,271,673 B2
(45) Date of Patent: Apr. 8, 2025

(54) OSCILLATOR LAYOUT

(71) Applicant: CHANGXIN MEMORY TECHNOLOGIES, INC., Hefei (CN)

(72) Inventors: Yuxia Wang, Hefei (CN); Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 505 days.

(21) Appl. No.: 17/804,995

(22) Filed: Jun. 1, 2022

(65) Prior Publication Data

US 2022/0292246 A1    Sep. 15, 2022

Related U.S. Application Data

(63) Continuation of application No. PCT/CN2021/112329, filed on Aug. 12, 2021.

(30) Foreign Application Priority Data

Oct. 28, 2020    (CN) .......................... 202011176618.5

(51) Int. Cl.
G06F 30/392    (2020.01)
G06F 30/3953    (2020.01)

(52) U.S. Cl.
CPC ........ G06F 30/392 (2020.01); G06F 30/3953 (2020.01)

(58) Field of Classification Search
CPC .................................................... G06F 30/392
(Continued)

(56) References Cited

U.S. PATENT DOCUMENTS 7,015,739 B2    3/2006    Lee
7,321,269 B2    1/2008    Drake
(Continued)

FOREIGN PATENT DOCUMENTS

CN    1542861 A    11/2004
CN    1675836 A    9/2005
(Continued)

OTHER PUBLICATIONS

Supplementary European Search Report in the European application No. 21870566.3, mailed on Dec. 9, 2022.
(Continued)

*Primary Examiner* — Eric D Lee
(74) *Attorney, Agent, or Firm* — Syncoda LLC; Feng Ma

(57) ABSTRACT

An oscillator layout includes: a first row layout region constituted by sequentially arranging a second B layout region, second A layout region, third B layout region and third A layout region in parallel; and a second row layout region constituted by sequentially arranging a first A layout region, first B layout region, fourth A layout region and fourth B layout region in parallel. Inputs and outputs of the first A layout region, second A layout region, third A layout region and fourth A layout region constitute a first ring topology, inputs and outputs of the first B layout region and third B layout region constitute a second ring topology, inputs and outputs of the second B layout region and fourth B layout region constitute a third ring topology, the second ring topology and third ring topology are both electrically connected to the first ring topology.

16 Claims, 8 Drawing Sheets

(58) Field of Classification Search
USPC .......................................................... 716/119
See application file for complete search history.

(56) References Cited

U.S. PATENT DOCUMENTS

| | | |
|---|---|---|
| 7,501,870 B2 | 3/2009 | Choi |
| 7,872,510 B2 | 1/2011 | Lee |
| 8,154,352 B2 | 4/2012 | Ueno |
| 9,030,244 B1 | 5/2015 | Luo |
| 9,252,753 B2 | 2/2016 | Lin |
| 9,270,256 B2 | 2/2016 | Lee |
| 9,667,252 B1 | 5/2017 | Lee |
| 9,985,619 B2 | 5/2018 | Lee |
| 9,998,125 B2 | 6/2018 | Balamurugan |
| 10,241,537 B2 | 3/2019 | Li |
| 10,249,354 B1 | 4/2019 | Lee |
| 10,270,429 B1 | 4/2019 | Wang |
| 10,411,675 B2 | 9/2019 | Kim |
| 10,418,983 B1 | 9/2019 | Lee |
| 10,458,857 B2 | 10/2019 | Rachala |
| 10,601,410 B1 | 3/2020 | Satoh |
| 10,630,273 B2 | 4/2020 | Tung |
| 10,700,672 B2 | 6/2020 | Savary |
| 10,784,846 B1 | 9/2020 | Bucossi |
| 10,826,476 B1 | 11/2020 | Bucossi |
| 10,862,460 B2 | 12/2020 | Kim |
| 2004/0032300 A1 | 2/2004 | Joordens |
| 2004/0189364 A1 | 9/2004 | Lee |
| 2007/0018737 A1 | 1/2007 | Drake |
| 2007/0090867 A1 | 4/2007 | Kim |
| 2007/0241826 A1 | 10/2007 | Ueno |
| 2008/0024182 A1 | 1/2008 | Choi |
| 2008/0024233 A1 | 1/2008 | Drake |
| 2008/0204094 A1 | 8/2008 | Hur |
| 2009/0051443 A1 | 2/2009 | Illegems |
| 2009/0115459 A1 | 5/2009 | Kwon |
| 2009/0302912 A1 | 12/2009 | Lee |
| 2012/0075025 A1 | 3/2012 | Ueno |
| 2015/0171836 A1 | 6/2015 | Lee et al. |
| 2015/0372665 A1 | 12/2015 | Tohidian et al. |
| 2016/0006420 A1 | 1/2016 | Lin |
| 2016/0241249 A1 | 8/2016 | Balamurugan et al. |
| 2017/0117887 A1 | 4/2017 | Lee et al. |
| 2017/0179956 A1 | 6/2017 | Lee et al. |
| 2017/0194947 A1 | 7/2017 | Wei |
| 2018/0166432 A1* | 6/2018 | Won ................... H03K 19/0008 |
| 2018/0358954 A1 | 12/2018 | Kim et al. |
| 2018/0364752 A1 | 12/2018 | Li et al. |
| 2019/0190501 A1 | 6/2019 | Wang et al. |
| 2019/0215146 A1 | 7/2019 | Ke et al. |
| 2019/0237127 A1 | 8/2019 | Moon et al. |
| 2019/0257696 A1 | 8/2019 | Rachala et al. |
| 2019/0280682 A1 | 9/2019 | Lee |
| 2019/0334508 A1 | 10/2019 | Tang |
| 2019/0348971 A1 | 11/2019 | Kim et al. |
| 2020/0052681 A1 | 2/2020 | Tung et al. |
| 2020/0136599 A1 | 4/2020 | Savary et al. |
| 2020/0160902 A1 | 5/2020 | Gans |
| 2020/0162066 A1 | 5/2020 | Gans |
| 2020/0336135 A1 | 10/2020 | Wang et al. |
| 2021/0036690 A1 | 2/2021 | Tang |
| 2021/0218388 A1 | 7/2021 | Wang et al. |

FOREIGN PATENT DOCUMENTS

| | | |
|---|---|---|
| CN | 1956329 A | 5/2007 |
| CN | 101141129 A | 3/2008 |
| CN | 101409541 A | 4/2009 |
| CN | 101629978 A | 1/2010 |
| CN | 103684365 A | 3/2014 |
| CN | 104270122 A | 1/2015 |
| CN | 104716929 A | 6/2015 |
| CN | 104734697 A | 6/2015 |
| CN | 105099445 A | 11/2015 |
| CN | 105281757 A | 1/2016 |
| CN | 205385473 U | 7/2016 |
| CN | 106374890 A | 2/2017 |
| CN | 106888007 A | 6/2017 |
| CN | 106941344 A | 7/2017 |
| CN | 105281757 B | 7/2018 |
| CN | 108768385 A | 11/2018 |
| CN | 110266294 A | 9/2019 |
| CN | 110830011 A | 2/2020 |
| CN | 111103530 A | 5/2020 |
| CN | 111147055 A | 5/2020 |
| JP | 2006333184 A | 12/2006 |
| KR | 20080009855 A | 1/2008 |
| KR | 100998677 B1 | 12/2010 |

OTHER PUBLICATIONS

Supplementary European Search Report in the European application No. 21856922.6, mailed on Nov. 2, 2022.
Supplementary European Search Report in the European application No. 21870482.3, mailed on Nov. 23, 2022.
Yyons2019, "Ring Oscillator Layout Design", https://maxbook118.com/html/2019/0901/6153212200002101,shtm, Sep. 2, 2019.
Zhang Tao et al., "Design of Low Noise Single Ended CMOS Ring Voltage controlled Oscillators", Microelectronics and Computing vol. 7 vol. 21 ISSN: 1000-7180, Jul. 31, 2004, p. 164-167.
Elad Alon, "Schematic and Layout Simulation Exercise", http://bwrcs.eecs.berkeley.edu/Classes/icdesign/eel41_f12/CurrentLabs/Lab%204.pdf, Sep. 23, 2009.
Zhou Shengming, "Integrated Circuit Design and Implementation Technology Based on Zeni", Xidian University Press, Oct. 31, 2013, p. 169, Figures 8-50.
Kyu-hyoun Kim et al., "A 20-GB/s 256-Mb DRAM with an inductorless Quadrature PLL and a Cascaded Pre-emphasis Transmitter", in IEEE Journal of Solid-State Circuits, vol. 41, No. 1, Jan. 2006, pp. 127-134.
Takashi Kusaga et al., "Four-State Ring Oscillator for Quadrature Signal Generation", ICSES 2008 International Conference on Sinngnals and Electronic Systems Krakow, Sep. 14-17, 2008, pp. 89-92.
First Office Action of the U.S. Appl. No. 17/449,525, issued on Jan. 21, 2022.
International Search Report in the international application No. PCT/CN2021/112329, mailed on Oct. 29, 2021.
International Search Report in the international application No. PCT/CN2021/118858, mailed on Dec. 2, 2021.
International Search Report in the international application No. PCT/CN2021/105207, mailed on Sep. 28, 2021.
International Search Report in the international application No. PCT/CN2021/105250, mailed on Oct. 13, 2021.
International Search Report in the international application No. PCT/CN2021/106019, mailed on Oct. 20, 2021.
International Search Report in the international application No. PCT/CN2021/107942, mailed on Oct. 20, 2021.

* cited by examiner

US 12,271,673 B2

OSCILLATOR LAYOUT

CROSS-REFERENCE TO RELATED APPLICATIONS

This application is a continuation of International Patent Application No. PCT/CN2021/112329 filed on Aug. 12, 2021, which claims priority to Chinese Patent Application No. 202011176618.5 filed on Oct. 28, 2020. The disclosures of these applications are hereby incorporated by reference in their entirety.

BACKGROUND

Dynamic Random Access Memories (DRAMs) are semiconductor memory devices commonly used in computers and are composed of many repeated memory units. In DRAM I/O circuits, high-speed clock signals having a specific frequency are required for reading and writing, and clock calibration.

A ring oscillator can be used to generate a high-speed clock signal in a DRAM, so as to satisfy the requirements as described above. A layout for defining a ring oscillator comprises a plurality of metal layers, which are interconnected. Metals in different layers have different directions, materials and different electrical properties, electrical properties of connecting holes between different metal layers are also different, and parasitic parameters which are correspondingly induced are also different. Therefore, the requirements such as symmetry, matching and minimum parasitic load need to be taken into consideration for a layout, so as to improve the electrical properties of an oscillator.

SUMMARY

The present disclosure relates to, but is not limited to, an oscillator layout.

Embodiments of the present disclosure provide an oscillator layout, including: A layout regions, which includes a first A layout region, a second A layout region, a third A layout region, and a fourth A layout region; B layout regions, which comprises a first B layout region, a second B layout region, a third B layout region, and a fourth B layout region, both the A layout regions and the B layout regions being layouts for inverters; a first row layout region, constituted by sequentially arranging the second B layout region, the second A layout region, the third B layout region, and the third A layout region in parallel; and a second row layout region, constituted by sequentially arranging the first A layout region, the first B layout region, the fourth A layout region, and the fourth B layout region in parallel, wherein inputs and outputs of the first A layout region, the second A layout region, the third A layout region, and the fourth A layout region constitute a first ring topology, inputs and outputs of the first B layout region and the third B layout region constitute a second ring topology, inputs and outputs of the second B layout region and the fourth B layout region constitute a third ring topology, and the second ring topology and the third ring topology are both electrically connected to the first ring topology.

BRIEF DESCRIPTION OF THE DRAWINGS

One or more embodiments are described by way of example with reference to the corresponding accompanying drawings. These exemplary descriptions are not to be construed as limiting the embodiments, and unless otherwise particularly stated, the figures in the accompanying drawings are not drawn to scale.

DETAILED DESCRIPTION

In layout design of an oscillator, different connection modes are used when arrangement positions in the layout are different, causing parasitic parameters different, so that characteristics of the oscillator are affected. Particularly for a high-speed oscillator, a slight different may still result in a great effect.

In addition, the existing oscillator layouts all include a plurality of metal layers, which are interconnected. Metals in different layers have different wiring directions and lengths, and may also cause different parasitic parameters of the oscillator, affecting electrical properties of the oscillator.

Embodiments of the present disclosure provide an optimally arranged oscillator layout, which mitigates problems caused by different parasitic parameters.

To make objectives, technical solutions, and advantages of the embodiments of the present disclosure clearer, the following describes in detail embodiments of the present disclosure with reference to the accompanying drawings. However, those skilled in the art may understand that in the embodiments of the present disclosure, technical details are described in the following description for readers to better understand the present disclosure. However, the technical solutions claimed in the present disclosure may also be implemented even if in the absence of the technical details and various changes and modifications based on the following embodiments.

Figure 1:
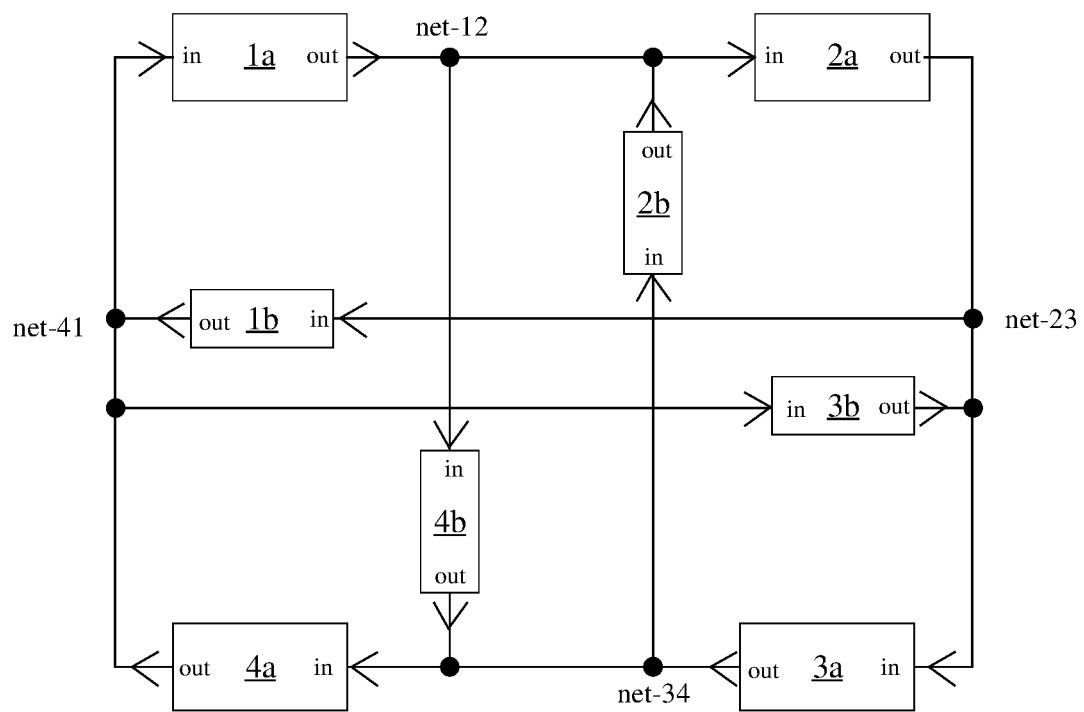
FIG. 1 is a schematic diagram of an oscillator corresponding to an oscillator layout provided by an embodiment of the present disclosure.
Figure 2:
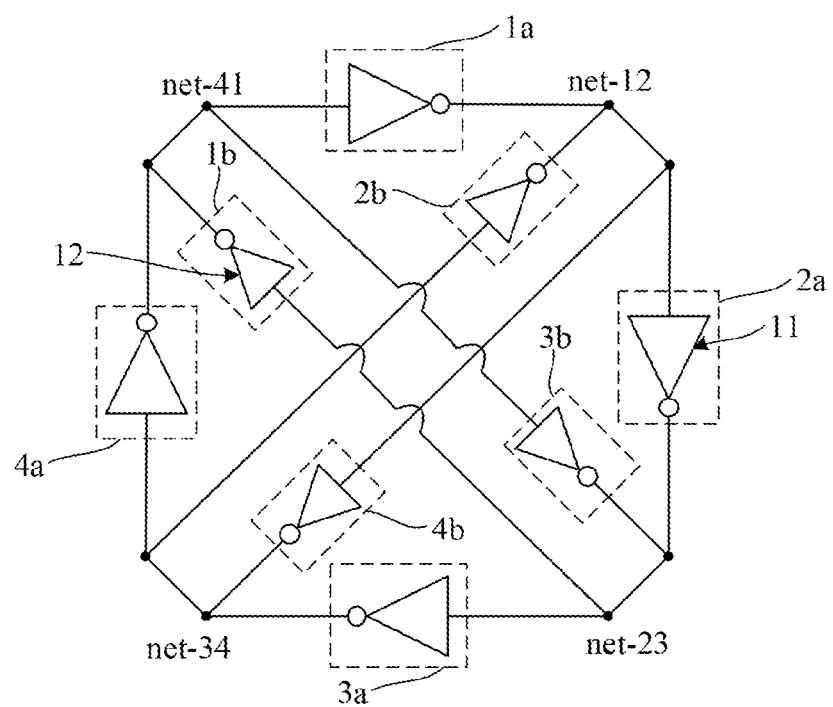
FIG. 2 is a schematic diagram of a circuit structure of an oscillator corresponding to an oscillator layout provided by an embodiment of the present disclosure.
Figure 3:
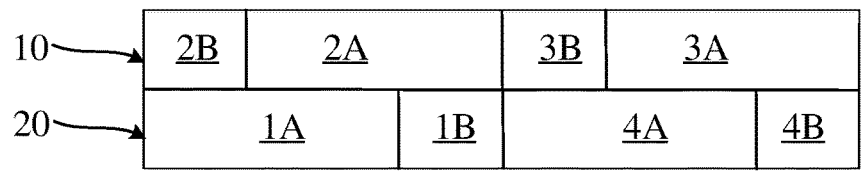
FIG. 3 is a schematic layout diagram of an oscillator layout provided by an embodiment of the present disclosure.

FIG. 1 is a schematic diagram of an oscillator corresponding to an oscillator layout provided by an embodiment of the present disclosure. FIG. 2 is a schematic diagram of a circuit structure of an oscillator corresponding to an oscillator layout provided by an embodiment of the present disclosure. FIG. 3 is a schematic layout diagram of an oscillator layout provided by an embodiment of the present disclosure.

With reference to FIG. 1 to FIG. 3, in some embodiments, an oscillator layout includes: A layout regions, which includes a first A layout region 1A, a second A layout region 2A, a third A layout region 3A, and a fourth A layout region 4A; B layout regions, which comprises a first B layout region 1B, a second B layout region 2B, a third B layout region 3B, and a fourth B layout region 4B, both the A layout regions and the B layout regions being layouts for inverters; a first row layout region 10, constituted by sequentially arranging the second B layout region 2B, the second A layout region 2A, the third B layout region 3B, and the third A layout region 3A in parallel; and a second row layout region 20, constituted by sequentially arranging the first A layout region 1A, the first B layout region 1B, the fourth A layout region 4A, and the fourth B layout region 4B in parallel, wherein inputs and outputs of the first A layout region 1A, the second A layout region 2A, the third A layout region 3A, and the fourth A layout region 4A constitute a first ring topology, inputs and outputs of the first B layout region 1B and the third B layout region 3B constitute a second ring topology, inputs and outputs of the second B layout region 2B and the fourth B layout region 4B constitute a third ring topology, and the second ring topology and the third ring topology are both electrically connected to the first ring topology.

The oscillator layout provided by an embodiment of the present disclosure is described in detail below with reference to specific embodiments.

The A layout region is a layout of a first inverter, and the B layout region is a layout of a second inverter. The first ring topology, the second ring topology, and the third ring topology constitute a ring oscillator. The first ring topology is a ring topology on an outer ring, and the second ring topology and the third ring topology are ring topologies on inner rings.

As shown in FIG. 1 and FIG. 2, the oscillator includes a plurality of a unit modules and a plurality of b unit modules. Each a unit module includes at least one first inverter 11, and each b unit module includes at least one second inverter 12. FIG. 1 and FIG. 2 are described by taking an example that each a unit module includes one first inverter, and each b unit module includes one second inverter.

Each a unit module corresponds to the corresponding A layout region, and numbering in positive order of natural numbers from 1, the plurality of a unit modules are divided into a first a unit module 1a, a second a unit module 2a, a third a unit module 3a, and a fourth a unit module 4a. The a unit modules correspond to the first A layout region 1A, the second A layout region 2A, the third A layout region 3A, and the fourth A layout region 4A.

Each b unit module corresponds to the corresponding B layout region, and numbering in positive order of natural numbers from 1, the plurality of b unit modules are divided into a first b unit module 1b, a second b unit module 2b, a third b unit module 3b, and a fourth b unit module 4b. The b unit modules correspond to the first B layout region 1B, the second B layout region 2B, the third B layout region 3B, and the fourth B layout region 4B.

In some embodiments, the oscillator includes four a unit modules and four b unit modules. An output of each b unit module is electrically connected to an input of the a unit module having a corresponding number. Exemplarily, an output of the first b unit module 1b is electrically connected to an input of the first a unit module 1a, an output of the second b unit module 2b is electrically connected to an input of the second a unit module 2a, an output of the third b unit module 3b is electrically connected to an input of the third a unit module 3a, and an output of the fourth b unit module 4b is electrically connected to an input of the fourth a unit module 4a. In addition, an output of each a unit module is electrically connected to an input of the b unit module having a previous number. Exemplarily, an output of the first a unit module 1a is electrically connected to an input of the fourth b unit module 4b, an output of the second a unit module 2a is electrically connected to an input of the first b unit module 1b, an output of the third a unit module 3a is electrically connected to an input of the second b unit module 2b, and an output of the fourth a unit module 4a is electrically connected to an input of the third b unit module 3b. In addition, an output of each a unit module is electrically connected to an input of the a unit module having a next number. Exemplarily, an output of the first a unit module 1a is electrically connected to an input of the second a unit module 2a, an output of the second a unit module 2a is electrically connected to an input of the third a unit module 3a, and an output of the fourth a unit module 4a is electrically connected to an input of the first a unit module 1a.

Specifically, the oscillator has following four nodes:

A node 12 net-12 electrically connects the output of the first a unit module 1a, the input of the second a unit module 2a, the input of the fourth b unit module 4b, and the output of the second b unit module 2b.

A node 23 net-23 electrically connects the output of the second a unit module 2a, the input of the third a unit module 3a, the input of the first b unit module 1b, and the output of the third b unit module 3b.

A node 34 net-34 electrically connects the output of the third a unit module 3a, the input of the fourth a unit module 4a, the input of the second b unit module 2b, and the output of the fourth b unit module 4b.

A node 41 net-41 electrically connects the output of the fourth a unit module 4a, the input of the first a unit module 1a, the output of the first b unit module 1b, and the input of the third b unit module 3b.

Still with reference to FIG. 1, FIG. 2, and FIG. 3, the first a unit module 1a, the node 12 net-12, the second a unit module 2a, the node 23 net-23, the third a unit module 3a, the node 34 net-34, the fourth a unit module 4a, and the node 41 net-41 constitute the first ring topology. The first b unit module 1b, the node 41 net-41, the third b unit module 3b, and the node 23 net-23 constitute the second ring topology. The second b unit module 2b, the node 12 net-12, the fourth b unit module 4b, and the node 34 net-34 constitute the third ring topology.

In some embodiments, the area of each A layout region is greater than that of each B layout region. In this way, a signal transmission rate of the first inverter 11 is greater than that of the second inverter 12. Accordingly, the first ring topology transmits an oscillating signal at a first transmission speed, the second ring topology and the third ring topology transmit oscillating signals at a second transmission speed, and the second transmission speed is less than the first transmission speed. The transmission speed is a speed of an oscillating signal from a high level to a low level, or from a low level to a high level. The lower the transmission speed is, the longer the transmission time is, the longer a cycle of the oscillating signal is, and the lower the frequency is.

In order to further improve the symmetry of the oscillator layout, in some embodiments, the height of each A layout region is equal to that of each B layout region, and the length of each A layout region is greater than that of each B layout region. It can be understood that in another embodiment, it may also be configured as that the length of each A is equal to that of each B layout region, and the height of each A layout region is greater than that of each B layout region.

It is to be noted that in another embodiment, the area of each A layout region may also be equal to that of each B layout region.

Figure 4:
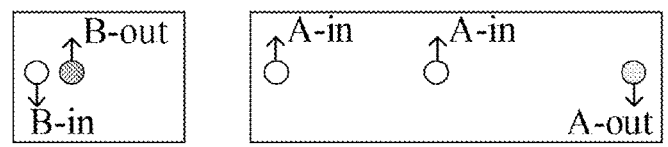
FIG. 4 is a schematic diagram of an A layout region and a B layout region.

In FIG. 4, the left drawing is a schematic diagram of a B layout region, including an input B-in and an output B-out of the B layout region, and the right drawing is a schematic diagram of a A layout region, including an input A-in and an output A-out of the A layout region. It is to be noted that because a size of the A layout region is relatively large, in order to improve the wiring reasonability and further improve the symmetry of the layout arrangement, in some embodiments, the A layout region is provided with two inputs A-in, and one input A-in is located at a middle position between the output A-out and the other input A-in.

FIG. 5 to FIG. 8 are schematic diagrams of wirings of an oscillator layout in an embodiment of the present disclosure.

Figure 5:
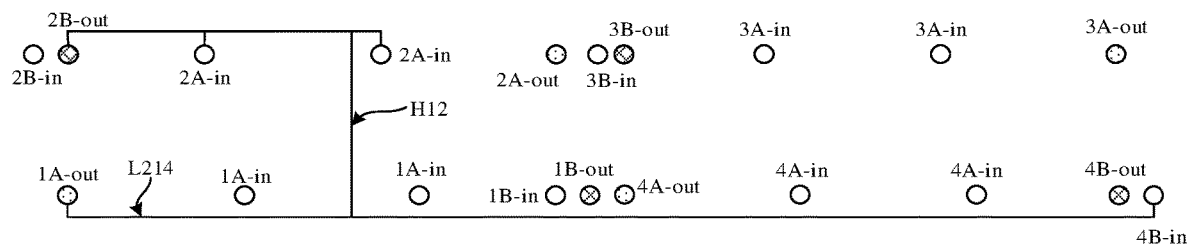
FIG. 5 is a first schematic diagram of wirings of an oscillator layout provided by an embodiment of the present disclosure.

As shown in FIG. 5, FIG. 5 illustrates a wiring trace of the node 12 net-12 in the oscillator layout: the output 1A-out of the first A layout region 1A (1AO for short), which is also the output 2B-out of the second B layout region 2B (2BO for short), enters the input 2A-in of the second A layout region 2A (2AI for short), and also enters the input 4B-in of the fourth B layout region 4B (4BI for short). The signal flow path represents 1AO-2BO-2AI-4BI.

Figure 6:
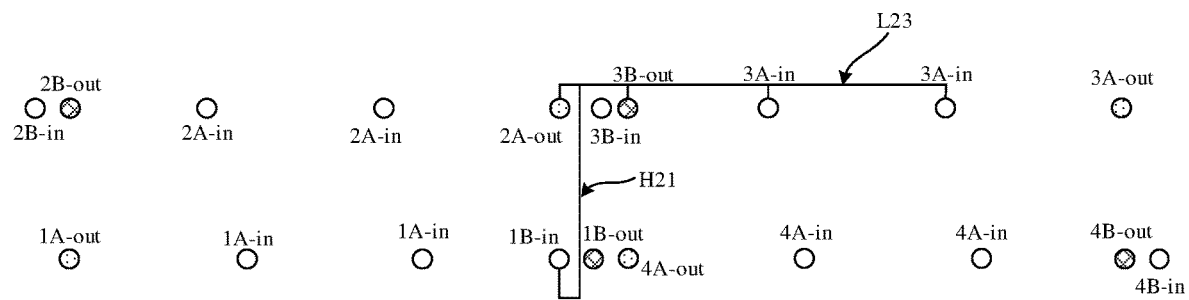
FIG. 6 is a second schematic diagram of wirings of an oscillator layout provided by an embodiment of the present disclosure.

As shown in FIG. 6, FIG. 6 illustrates a wiring trace of the node 23 net-23 in the oscillator layout: the output 2A-out of the second A layout region 2A (2AO for short), which is also the output 3B-out of the third B layout region 3B (3BO for short), enters the input 3A-in of the third A layout region 3A (3AI for short), and also enters the input 1B-in of the first B layout region 1B (1BI for short). The signal flow path represents 2AO-3BO-3AI-1BI.

Figure 7:
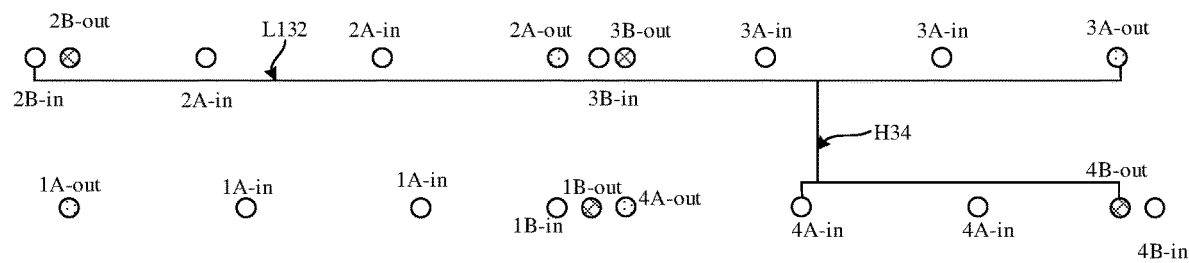
FIG. 7 is a third schematic diagram of wirings of an oscillator layout provided by an embodiment of the present disclosure.

As shown in FIG. 7, FIG. 7 illustrates a wiring trace of the node 34 net-34 in the oscillator layout: the output 3A-out of the third A layout region 3A (3AO for short), which is also the output 4B-out of the fourth B layout region 4B (4BO for short), enters the input 4A-in of the fourth A layout region 4A (4AI for short), and also enters the input 2B-in of the second B layout region 2B (2BI for short). The signal flow path represents 3AO-4BO-4AI-2BI.

Figure 8:
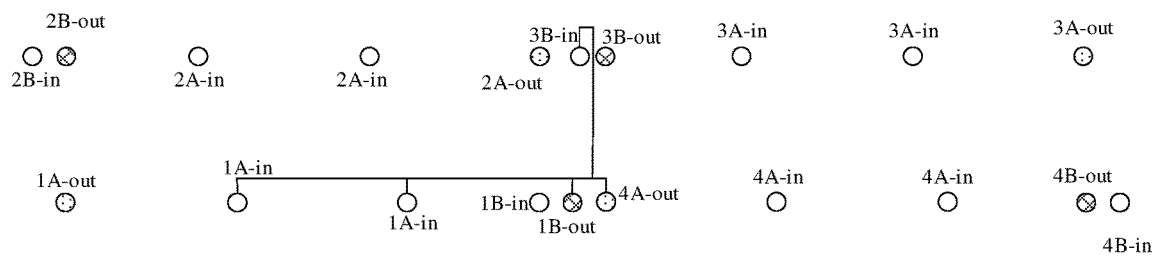
FIG. 8 is a fourth schematic diagram of wirings of an oscillator layout provided by an embodiment of the present disclosure.

As shown in FIG. 8, FIG. 8 illustrates a wiring trace of the node 41 net-41 in the oscillator layout: the output 4A-out of the fourth A layout region 4A (4AO for short), which is also the output 1B-out of the first B layout region 1B (1BO for short), enters the input 1A-in of the first A layout region 1A (1AI for short), and also enters the input 3B-in of the third B layout region 3B (3BI for short). The signal flow path represents 4AO-1BO-1AI-3BI.

In the foregoing embodiment, the wiring arrangement is made reasonable by using a reasonable arrangement of the A layout regions and the B layout regions. From the schematic diagram, it can be seen that the lengths of the incoming and outgoing wires of each unit module are the same.

With reference to FIG. 6, the electric connection from the output 2A-out of the second A layout region 2A to the input 3A-in of the third A layout region 3A has a length 23 L23. With reference to FIG. 8, the electric connection from the output 4A-out of the fourth A layout region 4A to the input 1A-in of the first A layout region 1A has a length 41 L41. The length 23 L23 is equal to the length 41 L41.

For the first row layout region 10 and the second row layout region 20, a lateral wiring on the same path is included from the output of each A layout region to the input of another A layout region, which avoids a difference in parasitic parameter caused by a difference of the lateral wiring.

With reference to FIG. 5, the electric connection from the output 1A-out of the first A layout region 1A to the input 2A-in of the second A layout region 2A has a height 12 H12. With reference to FIG. 7, the electric connection from the output 3A-out of the third A layout region 3A to the input 4A-in of the fourth A layout region 4A has a height 34 H34. The height 12 H12 is equal to the height 34 H34.

In this way, a longitudinal wiring on the same path is included from the output of each A layout region to the input of another A layout region, which avoids a difference in parasitic parameter caused by a difference of the longitudinal wiring.

With reference to FIG. 8, the electric connection from the output 4A-out of the fourth A layout region 4A to the input 3B-in of the third B layout region 3B has a height 43 H43. With reference to FIG. 6, the electric connection from the output 2A-out of the second A layout region 2A to the input 1B-in of the first B layout region 1B has a height 21 H21. The height 43 H43 is equal to the height 21 H21.

In this way, a longitudinal wiring is included from the output 2A-out of the second A layout region 2A of the first row layout region 10 to the input 1B-in of the first B layout region 1B of the second row layout region 20. Another longitudinal wiring is included from the output 4A-out of the fourth A layout region 4A of the second row layout region 20 to the input 3B-in of the third B layout region 3B of the first row layout region 10. Moreover, the two longitudinal wirings have the same path, which avoids a difference in parasitic parameter caused by a difference in length of the longitudinal wiring.

With reference to FIG. 7, the electric connection from the output 3A-out of the third A layout region 3A to the input 2B-in of the second B layout region 2B has a length 132 L132. With reference to FIG. 5, the electric connection from the output 1A-out of the first A layout region 1A to the input 4B-in of the fourth B layout region 4B has a length 214 L214. The length 132 L132 is equal to the length 214 L214.

In this way, for the first row layout region 10: a lateral wiring is included from the output 3A-out of the third A layout region 3A to the input 2B-in of the second B layout region 2B. For the second row layout region 20: another lateral wiring is included from the output 1A-out of the first A layout region 1A to the input 4B-in of the fourth B layout region 4B. Moreover, the two lateral wirings have the same path length, which avoids a difference in parasitic parameter caused by a difference of the lateral wiring.

With reference to FIG. 5, the electric connection from the output 2B-out of the second B layout region 2B to the input 2A-in of the second A layout region 2A has a length 122. With reference to FIG. 6, the electric connection from the output 3B-out of the third B layout region 3B to the input 3A-in of the third A layout region 3A has a length 133. With reference to FIG. 7, the electric connection from the output 1B-out of the first B layout region 1B to the input 1A-in of the first A layout region 1A has a length 211. With reference to FIG. 8, the electric connection from the output 4B-out of the fourth B layout region 4B to the input 4A-in of the fourth A layout region 4A has a length 244. The length 122, the length 133, the length 211, and the length 244 are all equal.

The length 122, the length 133, the length 211, and the length 244 are all the lengths of lateral wirings.

It is to be noted that the foregoing "equal" does not refer to exactly equal. In layout design, the tolerance range of a circuit is also called equal. The tolerance range, for example, may be an error of 1%, or 3%, or 5%, but is not limited thereto.

In the oscillator layout, the lateral wiring may be defined as a first metal layer, and the longitudinal wiring may be defined as a second metal layer. Moreover, the electrical resistivity of the first metal layer is different from that of the second metal layer. In the foregoing embodiments, the lengths of the lateral wirings are all equal, and the heights of the longitudinal wirings are all equal. Therefore, adverse effects caused by different electrical resistivity of resistors are avoided, and the parasitic resistance and parasitic capacitance on each symmetrical trace are equal or approximately equal.

In the technical solution of the oscillator layout provided by an embodiment of the present disclosure, by comprehensively considering the requirements of the symmetry, matching and minimum parasitic load in arrangement and wiring topology diagrams, the layout satisfies the high frequency and high symmetry requirements in circuit design. For example, when a frequency of an output signal of the oscillator reaches 3.2 Ghz, or 4.8 Ghz, or higher and a duty cycle of the output signal is close to 50%, the symmetry, the parasitic resistance and the parasitic capacitance of the layout all play a vital role in the performance of the oscillator.

Another embodiment of the present disclosure further provides an oscillator layout. The oscillator layout is substantially identical to that in the previous embodiment, and mainly differs by further including a third row layout region, constituted by sequentially arranging the third B layout region, the third A layout region, the fourth B layout region, and the fourth A layout region in parallel; and a fourth row layout region, constituted by sequentially arranging the second A layout region, the second B layout region, the first A layout region, and the first B layout region in parallel. The oscillator layout provided by another embodiment of the present disclosure is described in detail below with reference to specific embodiments. For the same or corresponding parts in the foregoing embodiment, please refer to the description of the foregoing embodiments. Details are not further described herein.

Figure 9:
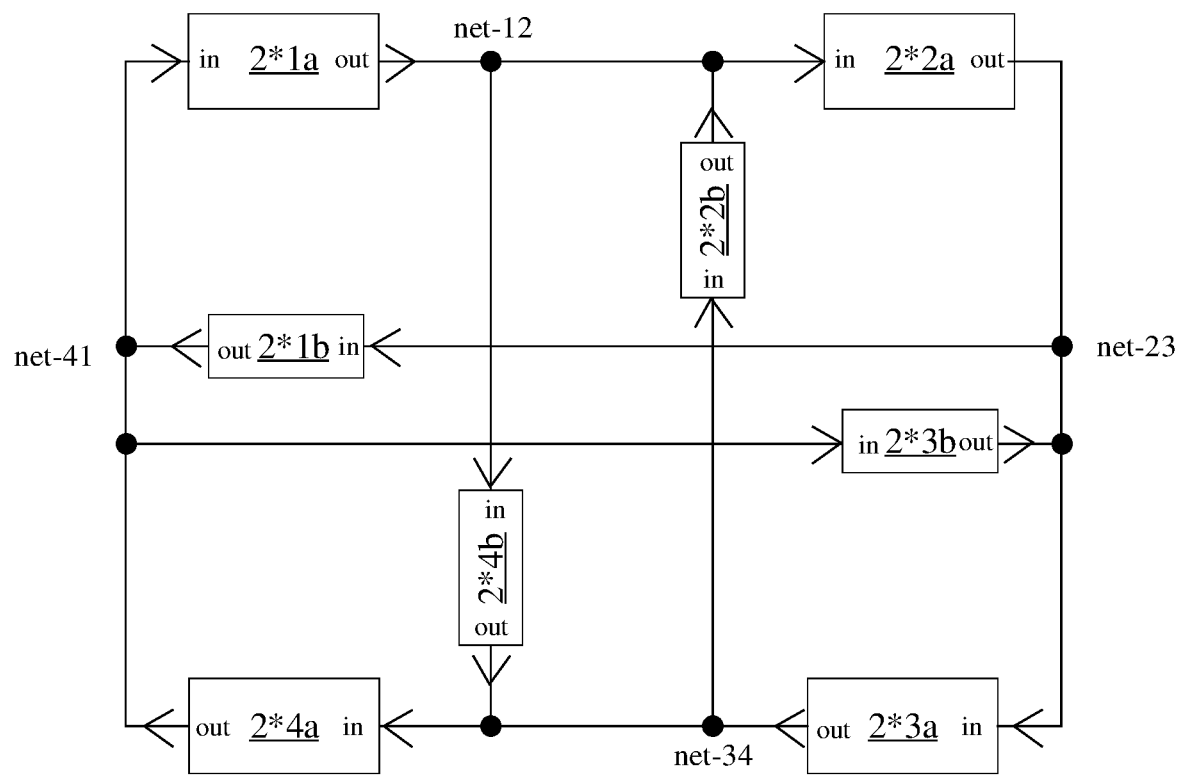
FIG. 9 is a diagram illustrating a principle of an oscillator corresponding to an oscillator layout provided by another embodiment of the present disclosure.
Figure 10:
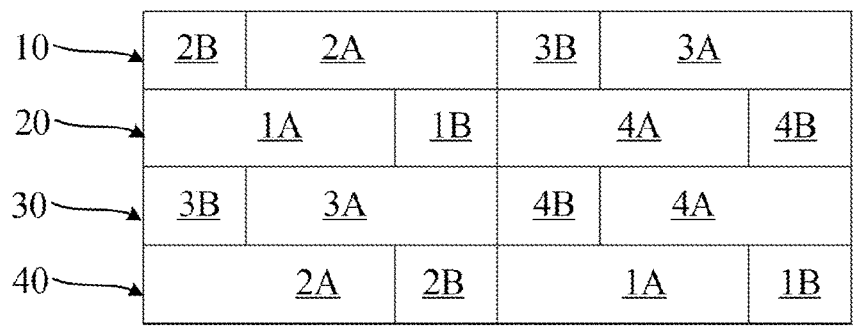
FIG. 10 is a schematic layout diagram of an oscillator layout provided by another embodiment of the present disclosure.

FIG. 9 is a can oscillator corresponding to an oscillator layout provided by another embodiment of the present disclosure. FIG. 10 is a schematic layout diagram of an oscillator layout provided by another embodiment of the present disclosure.

With reference to FIG. 9 to FIG. 10, in some embodiments, an oscillator layout includes: A layout regions, which includes a first A layout region 1A, a second A layout region 2A, a third A layout region 3A, and a fourth A layout region 4A; B layout regions, which comprises a first B layout region 1B, a second B layout region 2B, a third B layout region 3B, and a fourth B layout region 4B, both the A layout regions and the B layout regions being layouts for inverters; a first row layout region 10, constituted by sequentially arranging the second B layout region 2B, the second A layout region 2A, the third B layout region 3B, and the third A layout region 3A in parallel; and a second row layout region 20, constituted by sequentially arranging the first A layout region 1A, the first B layout region 1B, the fourth A layout region 4A, and the fourth B layout region 4B in parallel, wherein inputs and outputs of the first A layout region 1A, the second A layout region 2A, the third A layout region 3A, and the fourth A layout region 4A constitute a first ring topology, inputs and outputs of the first B layout region 1B and the third B layout region 3B constitute a second ring topology, inputs and outputs of the second B layout region 2B and the fourth B layout region 4B constitute a third ring topology, and the second ring topology and the third ring topology are both electrically connected to the first ring topology.

The oscillator layout further includes a third row layout region 30, constituted by sequentially arranging the third B layout region 3B, the third A layout region 3A, the fourth B layout region 4B, and the fourth A layout region 4A in parallel; and a fourth row layout region 40, constituted by sequentially arranging the second A layout region 2A, the second B layout region 2B, the first A layout region 1A, and the first B layout region 1B in parallel.

The oscillator layout is described in detail below with reference to specific embodiments.

As shown in FIG. 9, each a unit module corresponds to the corresponding A layout region, and numbering in positive order of natural numbers from 1, the plurality of a unit modules are divided into a first a unit module 2*1a, a second a unit module 2*2a, a third a unit module 2*3a, and a fourth a unit module 2*4a. Moreover, the first a unit module 2*1a corresponds to two first A layout regions 1A, the second a unit module 2*2a corresponds to two second A layout regions 2A, the third a unit module 2*3a corresponds to two third A layout regions 3A, and the fourth a unit module 2*4a corresponds to two fourth A layout regions 4A.

Each b unit module corresponds to the corresponding B layout region, and numbering in positive order of natural numbers from 1, the plurality of b unit modules are divided into a first b unit module 2*1b, a second b unit module 2*2b, a third b unit module 2*3b, and a fourth b unit module 2*4b. Moreover, the first b unit module 2*1b corresponds to two first B layout regions 1B, the second b unit module 2*2b corresponds to two second B layout regions 2B, the third b unit module 2*3b corresponds to two third B layout regions 3B, and the fourth b unit module 2*4b corresponds to two fourth B layout regions 4B.

The A layout region defines a first inverter, and the B layout region defines a second inverter. The oscillator includes a plurality of a unit modules and a plurality of b unit modules. Each a unit module includes two first inverters 11 which are connected in parallel, and each b unit module includes two second inverters 12 which are connected in parallel. For each a unit module, inputs of the two first inverters 11 are connected, and outputs of the two first inverters 11 are connected. For each b unit module, inputs of the two second inverters 12 are connected, and outputs of the two second inverters 12 are connected.

In this way, the lengths of connecting lines between the layout regions can be easily controlled to be similar or equal in design of the oscillator layout, so that the oscillator layout has relatively good symmetrical balance. Therefore, each key node of the oscillator in the layout has relatively a high load matching degree, and thus the delay of the inverter of each stage is equal. In addition, the lengths of the connecting lines between the layout regions are short, so that the parasitic resistance and the parasitic capacitance of the connecting lines are reduced, and thus the oscillator has good performance.

The oscillator has a node 12 net-12, a node 23 net-23, a node 34 net-34, and a node 41 net-41. For the detailed description of the four nodes, please refer to the foregoing embodiments.

In some embodiments, the area of each A layout region may also be greater than that of each B layout region. Furthermore, the height of each A layout region is equal to that of each B layout region, and the length of each A layout region is greater than that of each B layout region.

FIG. 11 to FIG. 14 are schematic diagrams of wirings of an oscillator layout.

Figure 11:
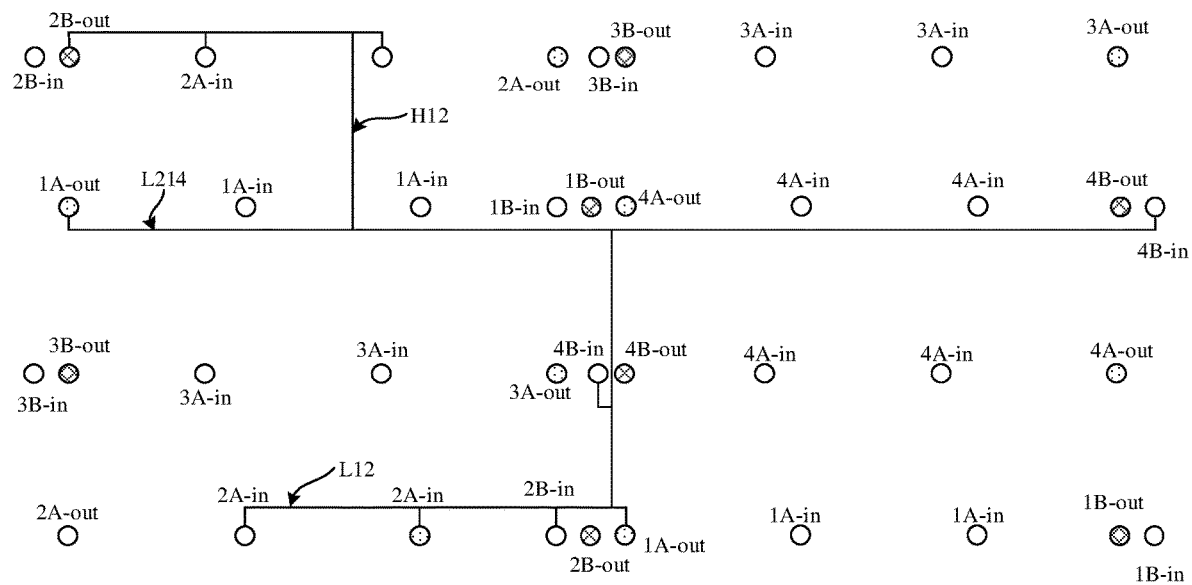
FIG. 11 is a first schematic diagram of wirings of an oscillator layout provided by another embodiment of the present disclosure.
Figure 12:
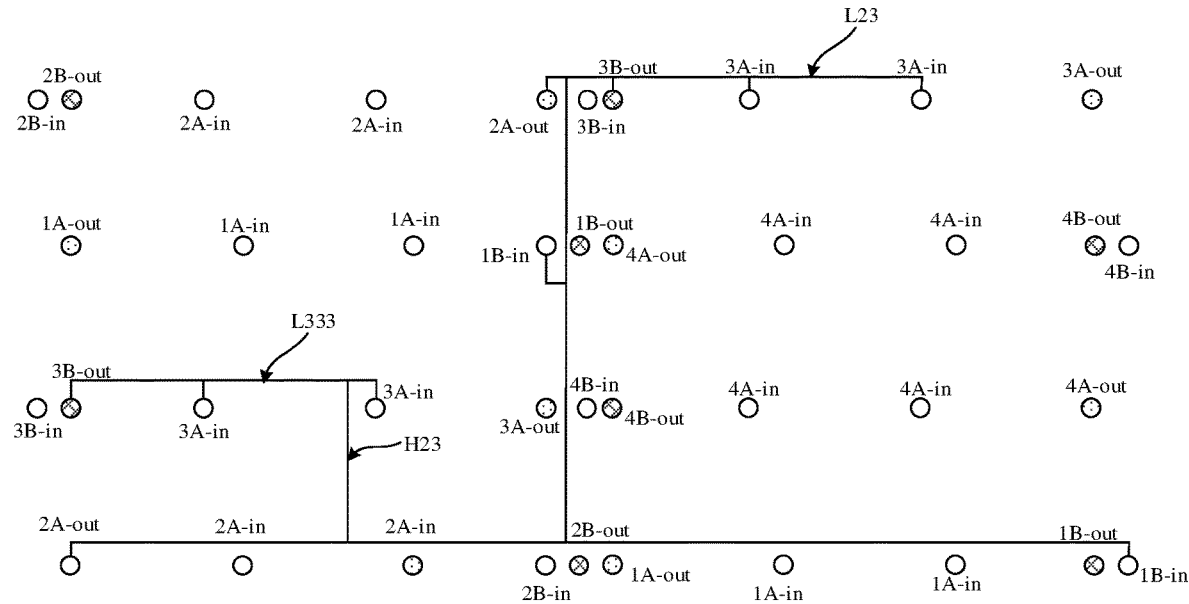
FIG. 12 is a second schematic diagram of wirings of an oscillator layout provided by another embodiment of the present disclosure.
Figure 13:
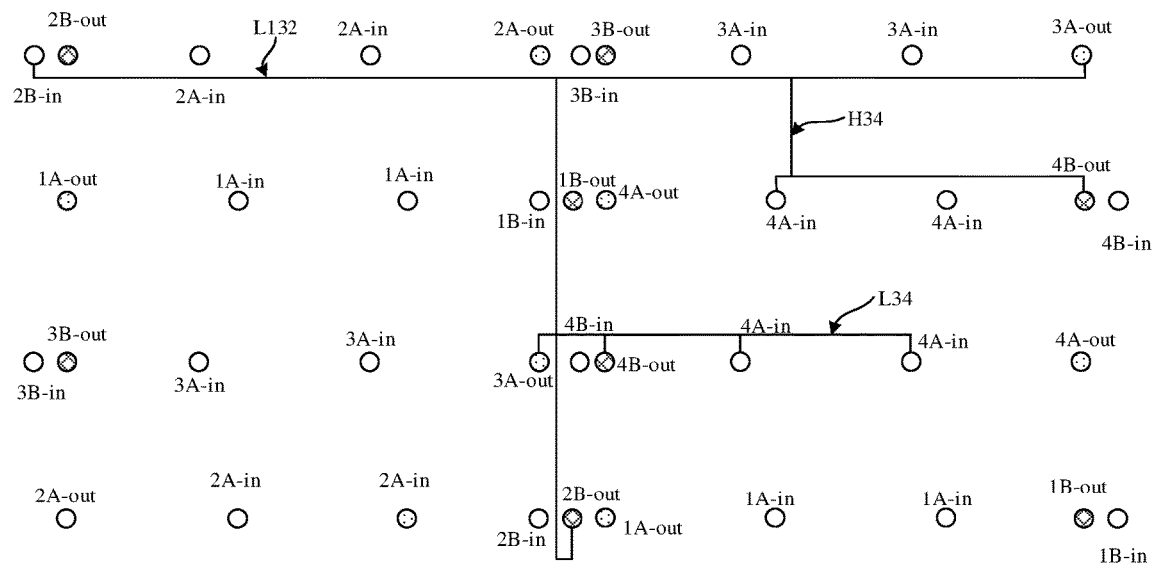
FIG. 13 is a third schematic diagram of wirings of an oscillator layout provided by another embodiment of the present disclosure.
Figure 14:
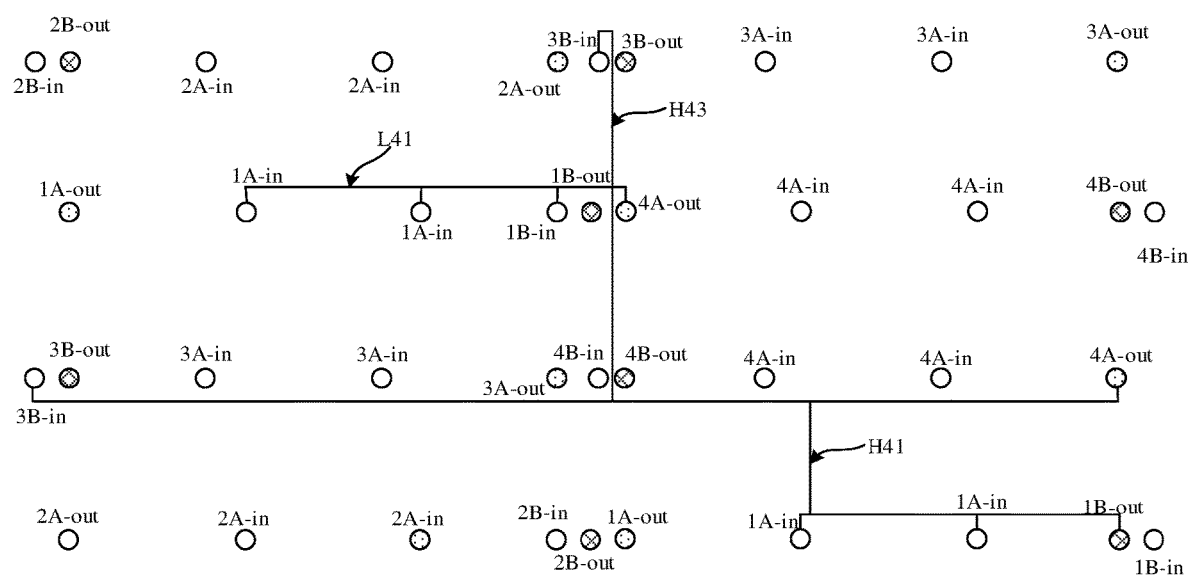
FIG. 14 is a fourth schematic diagram of wirings of an oscillator layout provided by another embodiment of the present disclosure.

With reference to FIG. 12, the electric connection from the output 2A-out of the second A layout region 2A of the first row layout region 10 to the input 3A-in of the third A layout region 3A of the first row layout region 10 has a length 23 L23. With reference to FIG. 14, the electric connection from the output 4A-out of the fourth A layout region 4A of the second row layout region 20 to the input 1A-in of the first A layout region 1A of the second row layout region 20 has a length 41 L41. With reference to FIG. 13, the electric connection from the output 3A-out of the third A layout region 3A of the third row layout region 30 to the input 4A-in of the fourth A layout region 4A of the third row layout region 30 has a length 34 L34. With reference to FIG. 11, the electric connection from the output 1A-out of the first A layout region 1A of the fourth row layout region 40 to the input 2A-in of the second A layout region 2A of the fourth row layout region 40 has a length 12 L12. The length 23 L23, the length 41 L41, the length 34 L34, and the length 12 L12 are all equal.

With reference to FIG. 13, the electric connection from the output 3A-out of the third A layout region 3A of the first row layout region 10 to the input 4A-in of the fourth A layout region 4A of the second row layout region 20 has a height 34 H34. With reference to FIG. 11, the electric connection from the output 1A-out of the first A layout region 1A of the second row layout region 20 to the input 2A-in of the second A layout region 2A of the first row layout region 10 has a height 12 H12. With reference to FIG. 14, the electric connection from the output 4A-out of the fourth A layout region 4A of the third row layout region 30 to the input 1A-in of the first A layout region 1A of the fourth row layout region 40 has a height 41 H41. With reference to FIG. 12, the electric connection from the output 2A-out of the second A layout region 2A of the fourth row layout region 40 to the input 3A-in of the third A layout region 3A of the third row layout region 40 has a height 23 H23. The height 34 H34, the height 12 H12, the height 41 H41, and the height 23 H23 are all equal.

With reference to FIG. 11 to FIG. 14, the electric connection from the output 2B-out of the second B layout region 2B of the first row layout region 10 to the input 2A-in of the second A layout region 2A of the first row layout region 10 has a length 122; the electric connection from the output 3B-out of the third B layout region 3B of the first row layout region 10 to the input 3A-in of the third A layout region 3A of the first row layout region 10 has a length 133; the electric connection from the output 1B-out of the first B layout region 1B of the second row layout region 20 to the input 1A-in of the first A layout region 1A of the second row layout region 20 has a length 211; the electric connection from the output 4B-out of the fourth B layout region 4B of the second row layout region 20 to the input 4A-in of the fourth A layout region 4A of the second row layout region 20 has a length 244; the electric connection from the output 3B-out of the third B layout region 3B of the third row layout region 30 to the input 3A-in of the third A layout region 3A of the third row layout region 30 has a length 333; the electric connection from the output of the fourth B layout region 4B of the third row layout region 30 to the input 4A-in of the fourth A layout region 4A of the third row layout region 30 has a length 344; the electric connection from the output 2B-out of the second B layout region 2B of the fourth row layout region 40 to the input 2A-in of the second A layout region 2A of the fourth row layout region 40 has a length 422; and the electric connection from the output 1B-out of the first B layout region 1B of the fourth row layout region 40 to the input 1A-in of the first A layout region 1A of the fourth row layout region 40 has a length 411, wherein the length 122, the length 133, the length 211, the length 244, the length 333, the length 344, the length 422, and the length 411 are all equal.

Still with reference to FIG. 11 to FIG. 14, the electric connection from the output 3A-out of the third A layout region 3A of the first row layout region 10 to the input 2B-in of the second B layout region 2B of the first row layout region 10 has a length 132; the electric connection from the output 1A-out of the first A layout region 1A of the second row layout region 20 to the input 4B-in of the fourth B layout region 4B of the second row layout region 20 has a length 214; the electric connection from the output 4A-out of the fourth A layout region 4A of the third row layout region 30 to the input 3B-in of the third B layout region 3B of the third row layout region 30 has a length 343; and the electric connection from the output 2A-out of the second A layout region 2A of the fourth row layout region 40 to the input 1B-in of the first B layout region 1B of the fourth row layout region 40 has a length 421, wherein the length 132, the length 214, the length 343, and the length 421 are all equal.

Still with reference to FIG. 11 to FIG. 14, for the output of the A layout region and the input of another A layout region:

in the third row layout region 30 and the fourth row layout region 40, the electric connection from the output 1A-out of the first A layout region 1A to the input 2A-in of the second A layout region 2A, and the electric connection from the output 3A-out of the third A layout region 3A to the input 4A-in of the fourth A layout region 4A are both lateral wirings. The electric connection from the output 2A-out of the second A layout region 2A to the input 3A-in of the third A layout region 3A, and the electric connection from the output 4A-out of the fourth A layout region 4A to the input 1A-in of the first A layout region 1A are both longitudinal wirings. Moreover, the first row layout region 10 and the second row layout region 20 are just the opposite. In the first row layout region 10 and the second row layout region 20, the electric connection from the output 1A-out of the first A layout region 1A to the input 2A-in of the second A layout region 2A, and the electric connection from the output 3A-out of the third A layout region 3A to the input 4A-in of the fourth A layout region 4A are both longitudinal wirings. The electric connection from the output 2A-out of the second A layout region 2A to the input 3A-in of the third A layout region 3A, and the electric connection from the output 4A-out of the fourth A layout region 4A to the input 1A-in of the first A layout region 1A are both lateral wirings.

In this way, there are a lateral wiring on the same path and a longitudinal wiring on the same path from the output of each A layout region to the input of another A layout region.

Still with reference to FIG. 11 to FIG. 14, for the output of the A layout region and the input of another B layout region:

in the third row layout region 30 and the fourth row layout region 40, the electric connection from the output 4A-out of the fourth A layout region 4A to the input 3B-in of the third B layout region 3B, and the electric connection from the output 2A-out of the second A layout region 2A to the input of the first B layout region 1B are both lateral wirings. The electric connection from the output 3A-out of the third A layout region 3A to the input 2B-in of the second B layout region 2B, and the electric connection from the output 1A-out of the first A layout region 1A to the input 4B-in of the fourth B layout region 4B are both longitudinal wirings. Moreover, the first row layout region 10 and the second row layout region 20 are just the opposite. In the first row layout region 10 and the second row layout region 20, the electric connection from the output 4A-out of the fourth A layout region 4A to the input 3B-in of the third B layout region 3B, and the electric connection from the output 2A-out of the second A layout region 2A to the input 1B-in of the fourth B layout region 1B are both longitudinal wirings. The electric connection from the output 3A-out of the third A layout region 3A to the input 2B-in of the second B layout region 2B, and the electric connection from the output 1A-out of the first A layout region 1A to the input 4B-in of the fourth B layout region 4B are both lateral wirings.

In this way, there are a lateral wiring on the same path and a longitudinal wiring on the same path from the output of each A layout region to the input of the corresponding B layout region.

In addition, each B layout region is arranged adjacent to an A layout region, to ensure that the path from the output of each B layout region to the input of the corresponding A layout region is the same. The first row layout region 10 and the second row layout region 20 constitute an upper half, and the third row layout region 30 and the fourth row layout region 40 constitute a lower half. Moreover, the upper half and the lower half are connected by means of the longitudinal wirings.

For the third row layout region 30 and the fourth row layout region 40, by taking the requirements such as symmetry, matching and minimum parasitic load into consideration when arranging the A layout regions and B layout regions as well as wirings, the oscillator layout can satisfy the requirements of high frequency and high symmetry in oscillator design, for example, an oscillator can generate a clock signal having a frequency of 3.2 Ghz, or 4.8 Ghz, or higher and a duty cycle close to 50%, or even equal to 50%.

Specifically, in an arrangement phase, by comprehensively considering the requirements of improving symmetry and reducing parasitic parameters, the plurality of A layout regions and the plurality of B layout regions are arranged in four rows, i.e., 16 layout regions (including 8 Å layout regions and 8B layout regions) are laterally arranged in a structure having 4 stepped tiers, i.e., the first row layout region 10, the second row layout region 20, the third row layout region 30, and the fourth row layout region 40, so as to achieve the optimal symmetry of the arrangement, which is as shown in FIG. 10 in detail. In a connecting line phase, wirings from the output of each layout region to the input of another layout region are reasonably arranged considering positions of the 16 layout regions, so that the lengths of the wirings are optimally matched. The length 23 L23, the length 41 L41, the length 34 L34, the length 12 L12, the height 34 H34, the height 12 H12, the height 41 H41, the height 23 H23, the length 122, the length 133, the length 211, the length 244, the length 333, the length 344, the length 422, and the length 411 all represent the lengths of the wirings. More details are shown in FIG. 11 to FIG. 14.

The technical solution provided by the embodiments of the present disclosure has at least the following advantages.

The embodiments of the present disclosure provide an oscillator layout which is excellent in structural performance, and by taking the requirements such as symmetry, matching and minimum parasitic load into consideration when arranging the A layout regions and B layout regions as well as wirings, the oscillator layout can satisfy the requirements of high frequency and high symmetry in oscillator design, so that the performance of oscillators is further improved.

Those skilled in the art should understand that the implementation modes are specific embodiments for implementing the present disclosure, but in actual application, various changes can be made thereto in form and in detail without departing from the spirit and the scope of the present disclosure. Any person skilled in the art can make various changes and modifications without departing from the spirit and the scope of the present disclosure. Therefore, the protection scope of the present disclosure should be subject to the scope defined by the claims.

What is claimed is:

1. An oscillator layout, comprising:
A layout regions, which comprises a first A layout region, a second A layout region, a third A layout region, and a fourth A layout region; B layout regions, which comprises a first B layout region, a second B layout region, a third B layout region, and a fourth B layout region, both the A layout regions and the B layout regions being layouts for inverters;
a first row layout region, constituted by sequentially arranging the second B layout region, the second A layout region, the third B layout region, and the third A layout region in parallel; and
a second row layout region, constituted by sequentially arranging the first A layout region, the first B layout region, the fourth A layout region, and the fourth B layout region in parallel, wherein
inputs and outputs of the first A layout region, the second A layout region, the third A layout region, and the fourth A layout region constitute a first ring topology, inputs and outputs of the first B layout region and the third B layout region constitute a second ring topology, inputs and outputs of the second B layout region and the fourth B layout region constitute a third ring topology, and the second ring topology and the third ring topology are both electrically connected to the first ring topology.

2. The oscillator layout of claim 1, wherein an area of each A layout region is greater than that of each B layout region.

3. The oscillator layout of claim 1, wherein a height of each A layout region is equal to that of each B layout region, and a length of each A layout region is greater than that of each B layout region.

4. The oscillator layout of claim 3, wherein an electric connection from the output of the second A layout region to the input of the third A layout region has a length 23, an electric connection from the output of the fourth A layout region to the input of the first A layout region has a length 41, and the length 23 is equal to the length 41.

5. The oscillator layout of claim 3, wherein an electric connection from the output of the first A layout region to the input of the second A layout region has a height 12, an electric connection from the output of the third A layout region to the input of the fourth A layout region has a height 34, and the height 12 is equal to the height 34.

6. The oscillator layout of claim 3, wherein an electric connection from the output of the fourth A layout region to the input of the third B layout region has a height 43, an electric connection from the output of the second A layout region to the input of the first B layout region has a height 21, and the height 43 is equal to the height 21.

7. The oscillator layout of claim 3, wherein an electric connection from the output of the third A layout region to the input of the second B layout region has a length 132, an electric connection from the output of the first A layout region to the input of the fourth B layout region has a length 214, and the length 132 is equal to the length 214.

8. The oscillator layout of claim 3, wherein an electric connection from the output of the second B layout region to the input of the second A layout region has a length 122, an electric connection from the output of the third B layout region to the input of the third A layout region has a length 133, an electric connection from the output of the first B layout region to the input of the first A layout region has a length 211, an electric connection from the output of the fourth B layout region to the input of the fourth A layout region has a length 244, and the length 122, the length 133, the length 211, and the length 244 are all equal.

9. The oscillator layout of claim 1, further comprising:
a third row layout region, constituted by sequentially arranging the third B layout region, the third A layout region, the fourth B layout region, and the fourth A layout region in parallel; and
a fourth row layout region, constituted by sequentially arranging the second A layout region, the second B layout region, the first A layout region, and the first B layout region in parallel.

10. The oscillator layout of claim 9, wherein a height of each A layout region is equal to that of each B layout region, and a length of each A layout region is greater than that of each B layout region.

11. The oscillator layout of claim 9, wherein
an electric connection from the output of the second A layout region of the first row layout region to the input of the third A layout region of the first row layout region has a length 23;
an electric connection from the output of the fourth A layout region of the second row layout region to the input of the first A layout region of the second row layout region has a length 41;
an electric connection from the output of the third A layout region of the third row layout region to the input of the fourth A layout region of the third row layout region has a length 34; and
an electric connection from the output of the first A layout region of the fourth row layout region to the input of the second A layout region of the fourth row layout region has a length 12, wherein
the length 23, the length 41, the length 34, and the length 12 are all equal.

12. The oscillator layout of claim 9, wherein
an electric connection from the output of the third A layout region of the first row layout region to the input of the fourth A layout region of the second row layout region has a height 34;
an electric connection from the output of the first A layout region of the second row layout region to the input of the second A layout region of the first row layout region has a height 12,
an electric connection from the output of the fourth A layout region of the third row layout region to the input of the first A layout region of the fourth row layout region has a height 41; and
an electric connection from the output of the second A layout region of the fourth row layout region to the input of the third A layout region of the third row layout region has a height 23, wherein
the height 34, the height 12, the height 41, and the height 23 are all equal.

13. The oscillator layout of claim 9, wherein
an electric connection from the output of the second B layout region of the first row layout region to the input of the second A layout region of the first row layout region has a length 122;
an electric connection from the output of the third B layout region of the first row layout region to the input of the third A layout region of the first row layout region has a length 133;
an electric connection from the output of the first B layout region of the second row layout region to the input of the first A layout region of the second row layout region has a length 211;
an electric connection from the output of the fourth B layout region of the second row layout region to the input of the fourth A layout region of the second row layout region has a length 244;
an electric connection from the output of the third B layout region of the third row layout region to the input of the third A layout region of the third row layout region has a length 333;
an electric connection from the output of the fourth B layout region of the third row layout region to the input of the fourth A layout region of the third row layout region has a length 344;
an electric connection from the output of the second B layout region of the fourth row layout region to the input of the second A layout region of the fourth row layout region has a length 422; and
an electric connection from the output of the first B layout region of the fourth row layout region to the input of the first A layout region of the fourth row layout region has a length 411, wherein
the length 122, the length 133, the length 211, the length 244, the length 333, the length 344, the length 422, and the length 411 are all equal.

14. The oscillator layout of claim 9, wherein
an electric connection from the output of the third A layout region of the first row layout region to the input of the second B layout region of the first row layout region has a length 132;
an electric connection from the output of the first A layout region of the second row layout region to the input of the fourth B layout region of the second row layout region has a length 214;
an electric connection from the output of the fourth A layout region of the third row layout region to the input of the third B layout region of the third row layout region has a length 343; and an electric connection from the output of the second A layout region of the fourth row layout region to the input of the first B layout region of the fourth row layout region has a length 421, wherein the length 132, the length 214, the length 343, and the length 421 are all equal.

15. The oscillator layout of claim 9, wherein there are a lateral wiring on a same path and a longitudinal wiring on a same path from the output of each A layout region to the input of another A layout region.

16. The oscillator layout of claim 9, wherein there are a lateral wiring on a same path and a longitudinal wiring on a same path from the output of each A layout region to the input of the corresponding B layout region layout region.

\* \* \* \* \*